United States Patent
Hsiao

(10) Patent No.: US 8,117,585 B2
(45) Date of Patent: Feb. 14, 2012

(54) SYSTEM AND METHOD FOR TESTING SIZE OF VIAS

(75) Inventor: Chun-Shan Hsiao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 217 days.

(21) Appl. No.: 12/648,383

(22) Filed: Dec. 29, 2009

(65) Prior Publication Data

US 2010/0264933 A1 Oct. 21, 2010

(30) Foreign Application Priority Data

Apr. 16, 2009 (CN) .......................... 2009 1 0301593

(51) Int. Cl.
*G06F 17/50* (2006.01)

(52) U.S. Cl. ........ 716/137; 716/111; 716/122; 716/139; 716/136

(58) Field of Classification Search ................... 716/137, 716/111, 122, 139, 136
See application file for complete search history.

(56) References Cited

U.S. PATENT DOCUMENTS

| | | | | |
|---|---|---|---|---|
| 4,028,675 A * | 6/1977 | Frankenberg | ................. | 711/106 |
| 6,037,547 A * | 3/2000 | Blish, II | ........................ | 174/264 |
| 6,469,530 B1 * | 10/2002 | Johnson et al. | .......... | 324/750.25 |
| 6,886,151 B2 * | 4/2005 | Tanaka | ........................... | 716/130 |
| 6,983,434 B1 * | 1/2006 | Frank et al. | .................... | 716/112 |
| 2005/0029013 A1 * | 2/2005 | Lee | ................ | 174/262 |
| 2005/0237776 A1 * | 10/2005 | Gropper et al. | ................... | 365/1 |
| 2005/0246670 A1 * | 11/2005 | Bois et al. | ........................ | 716/5 |
| 2005/0249479 A1 * | 11/2005 | Frank et al. | .................. | 385/147 |
| 2006/0123377 A1 * | 6/2006 | Schultz et al. | ................. | 716/11 |
| 2009/0058445 A1 * | 3/2009 | Leon | ............................ | 324/757 |

FOREIGN PATENT DOCUMENTS

CN 101236078 A 8/2008

* cited by examiner

*Primary Examiner* — Phallaka Kik
(74) *Attorney, Agent, or Firm* — Altis Law Group, Inc.

(57) ABSTRACT

A system and method for testing size of vias reads a component group from a storage system and reads a via size of each via in the component group. If the via size of a via accords with a standard size corresponding to the component group, the via is determined as a qualified via. If the via size of a via does not accord with the standard size, the via is determined as an unqualified via. The unqualified via is highlighted on a printed circuit board (PCB) design map displayed on a display.

17 Claims, 4 Drawing Sheets

SYSTEM AND METHOD FOR TESTING SIZE OF VIAS

BACKGROUND

1. Technical Field

Embodiments of the present disclosure relate to vias testing, and more particularly to a system and method for testing size of vias.

2. Description of Related Art

Printed circuit boards (PCBs) having multiple layers are called multilayer PCBs. The multilayer PCBs are composed of between one and twenty-four conductive layers separated and supported by layers of insulating material (substrates) laminated (glued with heat, pressure, or vacuum) together. Adjacent layers may be connected together through a drilled hole, which is called a via. The use of vias brings equivalent serial inductance (ESL), which leads to low-frequency power supply noise and high-frequency electromagnetic interference. The ESL is actually proportional to a via size. Thus, it is important to control the via size to limit the ESL. However, it is generally difficult, laborious, and time-consuming to control the via size manually.

What is needed, therefore, is an improved system and method for testing size of vias.

DETAILED DESCRIPTION

All of the processes described below may be embodied in, and fully automated via, functional modules executed by one or more general purpose processors. The functional modules may be stored in any type of computer-readable medium or other computer storage device. Some or all of the methods may alternatively be embodied in specialized computer hardware or communication apparatus.

Figure 1:
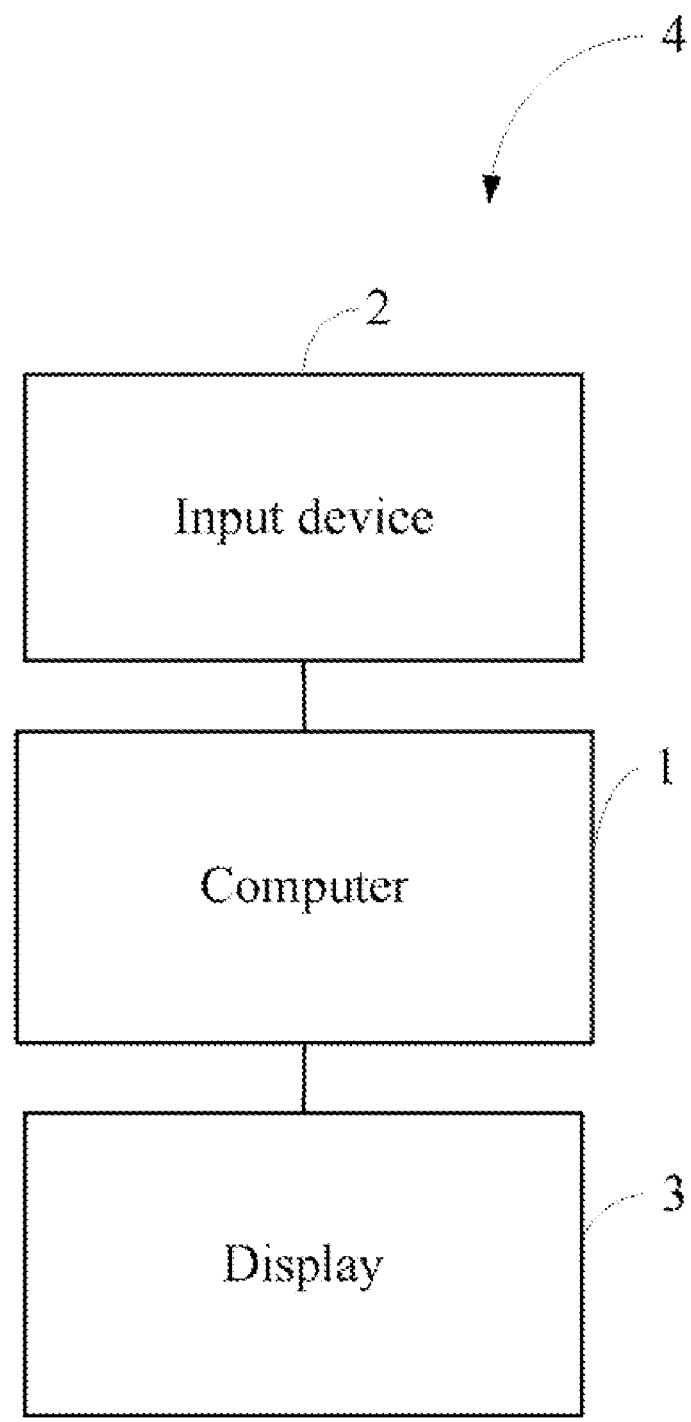
FIG. 1 is a block diagram of one embodiment of a system for testing size of vias.
Figure 4:
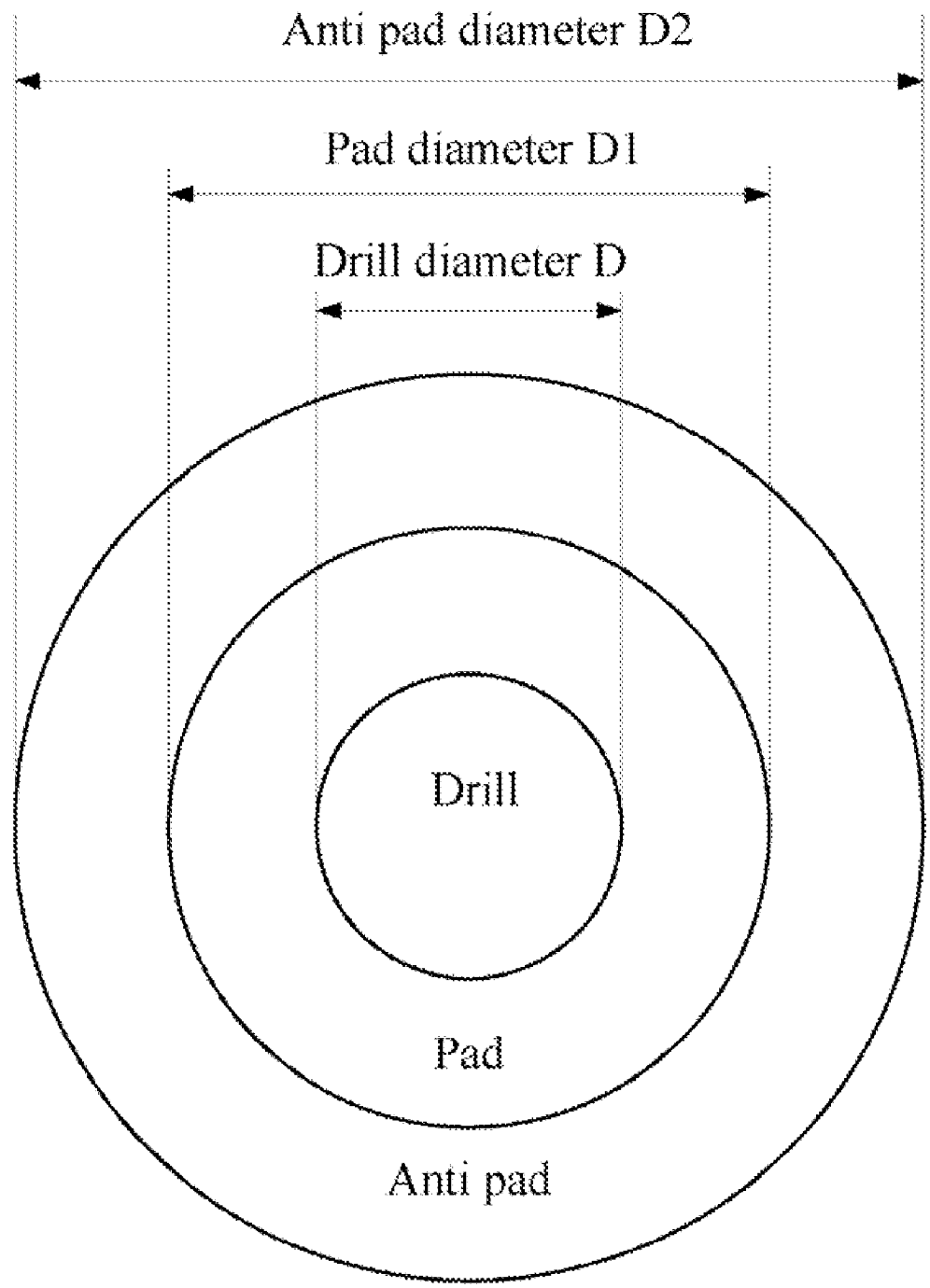
FIG. 4 is a schematic diagram illustrating one embodiment of a via.

FIG. 1 is a block diagram of one embodiment of a system 4 for testing size and distribution of vias. The system 4 includes a computer 1, an input device 2, and a display 3. The computer 1 connects with the input device 2 and the display 3. The input device 2 may be a keyboard, a mouse, for example. The display 3 provides a graphic user interface (GUI). The GUI displays a printed circuit board (PCB) design map. The PCB design map may include a plurality of components. The components may be capacitors, resistors, transistors, integrated circuits, and/or vias, for example. As shown in FIG. 4, a via includes a drill, a pad, and an anti pad. A via size includes a drill diameter D, a pad diameter D1, and an anti pad diameter D2. The via may generate an equivalent serial inductance and a parasitic capacitance. If the via size of the via accords with a standard via size, the equivalent serial inductance and the parasitic capacitance are acceptable.

Figure 2:
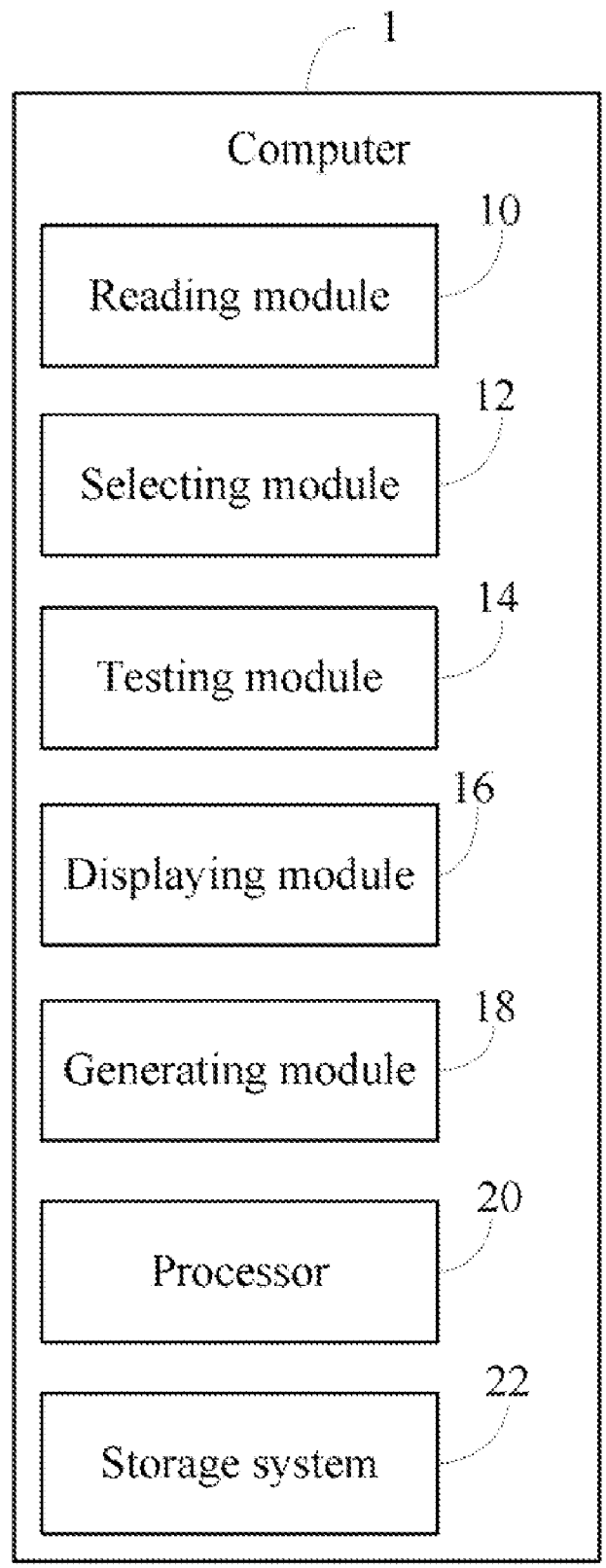
FIG. 2 is a block diagram of one embodiment of functional modules of a computer in FIG. 1.

FIG. 2 is a block diagram of functional modules of the computer 1 in FIG. 1. In one embodiment, the computer 1 may include a reading module 10, a selecting module 12, a testing module 14, a displaying module 16, and a generating module 18. The computer may further include a processor 20 and a storage system 22. It may be understood that one or more specialized or general purpose processors, such as the processor 20, may be used to execute one or more computerized codes of the functional modules 10, 12, 14, 16, and 18. The one or more computerized codes of the functional modules 10, 12, 14, 16, and 18 may be stored in the storage system 22 of the computer 1. The storage system 22 stores various kinds of data, such as the standard via sizes, the PCB design map and a plurality of component groups, for example. The component group includes a plurality of components. Each component group corresponds to a standard via size. The standard via size includes a standard drill diameter, a standard pad diameter, and a standard anti pad diameter. The component distributing map shows the distribution of all the vias in the PCB.

The reading module 10 reads a component group to be tested from the storage system 22. The reading module 10 also reads a via size of each via in the component group.

The selecting module 12 selects a standard via size corresponding to the component group from the storage system 22. In one embodiment, the standard drill diameter may be 10 mils. The standard pad diameter may be 20 mils. The standard anti pad diameter may be 28 mils.

The testing module 14 tests if each via in the component group is qualified according to the standard via size. If a drill diameter of the via is not larger than the standard drill diameter, a pad diameter of the via is not smaller than the standard pad diameter, and an anti pad diameter of the via is not larger than the standard anti pad diameter, the testing module 14 determines that the via size is qualified. If the drill diameter of the via is larger than the standard drill diameter, the pad diameter of the via is smaller than the standard pad diameter, or the anti pad diameter of the via is larger than the standard anti pad diameter, the testing module 14 determines that the via size is unqualified. The testing module 14 further generates a test result of all the vias in the component group. The test result represents that which vias are qualified, and which vias are unqualified.

The displaying module 16 highlights the vias that are unqualified in the PCB design map displayed on the display 3. In one embodiment, the vias that are unqualified are highlighted in a different color. Accordingly, using the test results, the system 4 may be used to design and/or debug a printed circuit board with appropriately sized vias according to the components on the PCB.

The generating module 18 generates a report to display the test result of all the vias in the component group.

Figure 3:
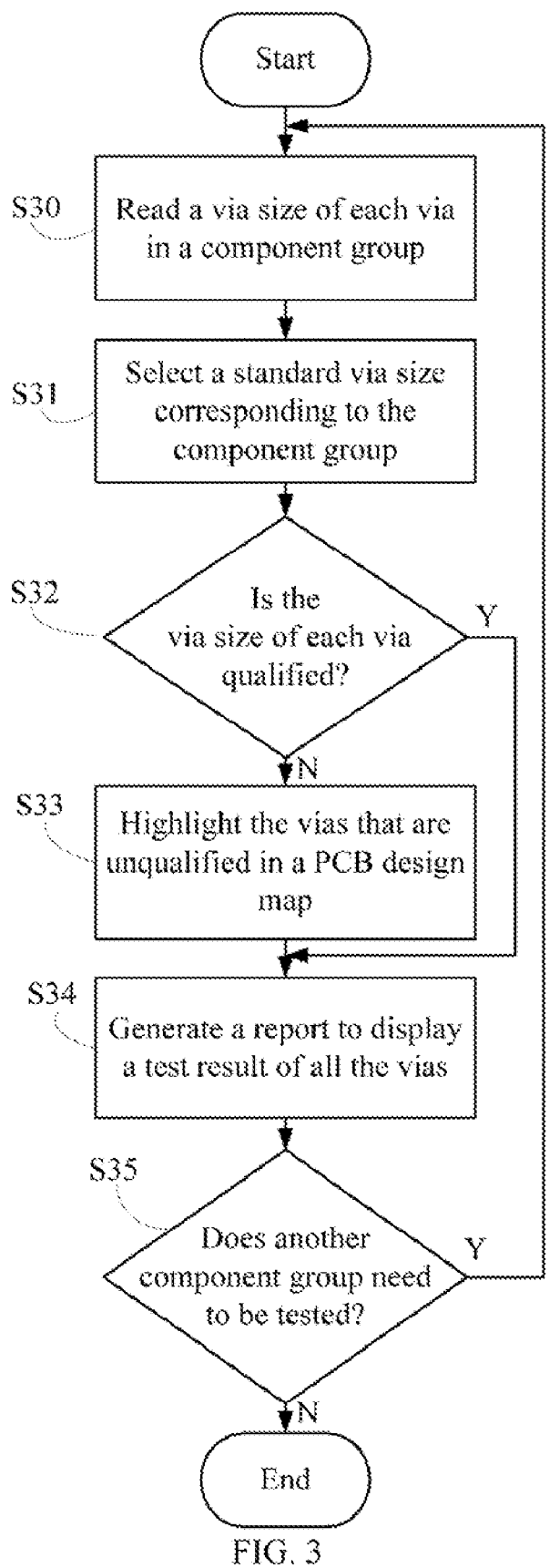
FIG. 3 is a flowchart of one embodiment of a method for testing size of vias.

FIG. 3 is a flowchart of one embodiment of a method for testing the size of vias. Depending on the embodiment, additional blocks may be added, others removed, and the ordering of the blocks may be changed.

In block S30, the reading module 10 reads a component group to be tested from the storage system 22 and reads a via size of each via in the component group.

In block S31, the selecting module 12 selects a standard via size corresponding to the component group from the storage system 22.

In block S32, the testing module 14 tests if each via in the component group is qualified according to the standard via size. If there is any via in the component group being unqualified, block S33 is implemented. If all the vias in the component group are qualified, block S34 is implemented.

In block S33, the displaying module 16 highlights the vias that are unqualified in the PCB design map displayed on the display 3.

In block S34, the generating module 18 generates a report to display a test result of all the vias in the component group. The test result represents that which vias are qualified, and which vias are unqualified.

In block S35, the reading module 10 detects if there is any other component group needs to be tested. If there is another component group needs to be tested, block S30 is repeated. If there is no component group needs to be tested, the procedure ends.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A system for testing size of vias, the system comprising:
a storage system; and
at least one processor to execute one or more programs stored in the storage system, the one or more programs comprising:
a reading module operable to read a component group to be tested from the storage system, and a via size of each via in the component group;
a selecting module operable to select a standard via size corresponding to the component group from the storage system;
a testing module operable to test if each via in the component group is qualified according to the standard via size, and generate a test result of all the vias in the component group;
a displaying module operable to highlight the vias that are unqualified in a printed circuit board (PCB) design map displayed on a display; and
a generating module operable to generate a report to list the test result of all the vias in the component group.

2. The system of claim 1, wherein the test result represents which vias are qualified, and which vias are unqualified.

3. The system of claim 1, wherein if the via size of each via accords with the standard via size, an equivalent serial inductance and a parasitic capacitance that the via generates are acceptable.

4. The system of claim 1, wherein the standard via size comprises a standard drill diameter, a standard pad diameter, and a standard anti pad diameter.

5. The system of claim 4, wherein the testing module is further operable to determine that the via size is qualified if a drill diameter of the via is not larger than the standard drill diameter, a pad diameter of the via is not smaller than the standard pad diameter, and an anti pad diameter of the via is not larger than the standard anti pad diameter, and determine that the via size is unqualified if the drill diameter of the via is larger than the standard drill diameter, the pad diameter of the via is smaller than the standard pad diameter, and the anti pad diameter of the via is larger than the standard anti pad diameter.

6. A computer-implemented method being executed by a processor of a computer for testing size of vias, the method comprising:
(a) reading a component group to be tested from a storage system and a via size of each via in the component group;
(b) selecting a standard via size corresponding to the component group from the storage system;
(c) testing, using the processor, if each via in the component group is qualified according to the standard via size;
(d) highlighting the vias that are unqualified in a printed circuit board (PCB) design map displayed on a display; and
(e) generating a report to list a test result of all the vias in the component group.

7. The method of claim 6, wherein the test result represents which vias are qualified, and which vias are unqualified.

8. The method of claim 6, wherein if the via size of each via accords with the standard via size, an equivalent serial inductance and a parasitic capacitance that the via generates are acceptable.

9. The method of claim 6, wherein the standard via size comprises a standard drill diameter, a standard pad diameter, and a standard anti pad diameter.

10. The method of claim 9, wherein block (c) comprises:
determining that the via size is qualified if a drill diameter of the via is not larger than the standard drill diameter, a pad diameter of the via is not smaller than the standard pad diameter, and an anti pad diameter of the via is not larger than the standard anti pad diameter; and
determining that the via size is unqualified if the drill diameter of the via is larger than the standard drill diameter, the pad diameter of the via is smaller than the standard pad diameter, and the anti pad diameter of the via is larger than the standard anti pad diameter.

11. The method of claim 6, further comprising: repeating block (a) if there is any other component group that needs to be tested.

12. A non-transitory computer-readable medium having stored therein instructions that, when executed by a computer, cause the computer to perform a method for testing size of vias comprising:
(a) reading a component group to be tested from a storage system and a via size of each via in the component group;
(b) selecting a standard via size corresponding to the component group from the storage system;
(c) testing if each via in the component group is qualified according to the standard via size;
(d) highlighting the vias that are unqualified in a printed circuit board (PCB) design map displayed on a display; and
(e) generating a report to list a test result of all the vias in the component group.

13. The non-transitory computer-readable medium of claim 12, wherein the test result represents which vias are qualified, and which vias are unqualified.

14. The non-transitory computer-readable medium of claim 12, wherein if the via size of each via accords with the standard via size, an equivalent serial inductance and a parasitic capacitance that the via generates are acceptable.

15. The non-transitory computer-readable medium of claim 12, wherein the standard via size comprises a standard drill diameter, a standard pad diameter, and a standard anti pad diameter.

16. The non-transitory computer-readable medium of claim 15, wherein block (c) comprises:
determining that the via size is qualified if a drill diameter of the via is not larger than the standard drill diameter, a pad diameter of the via is not smaller than the standard pad diameter, and a anti pad diameter of the via is not larger than the standard anti pad diameter; and
determining that the via size is unqualified if the drill diameter of the via is larger than the standard drill diameter, the pad diameter of the via is smaller than the standard pad diameter, and the anti pad diameter of the via is larger than the standard anti pad diameter.

17. The non-transitory computer-readable medium of claim 12, further comprising: repeating block (a) if there is any other component group that needs to be tested.

* * * * *